United States Patent
Egashira et al.

(10) Patent No.: US 11,967,750 B2
(45) Date of Patent: Apr. 23, 2024

(54) WILKINSON-TYPE COMBINER AND RF GENERATOR

(71) Applicant: HITACHI KOKUSAI ELECTRIC INC., Tokyo (JP)

(72) Inventors: Sunao Egashira, Tokyo (JP); Kenji Nasu, Tokyo (JP); Yuichiro Suenaga, Tokyo (JP); Naoya Fujimoto, Tokyo (JP)

(73) Assignee: HITACHI KOKUSAI ELECTRIC INC., Tokyo (JP)

(*) Notice: Subject to any disclaimer, the term of this patent is extended or adjusted under 35 U.S.C. 154(b) by 435 days.

(21) Appl. No.: 17/434,604

(22) PCT Filed: Feb. 6, 2020

(86) PCT No.: PCT/JP2020/004606
§ 371 (c)(1),
(2) Date: Aug. 27, 2021

(87) PCT Pub. No.: WO2020/189073
PCT Pub. Date: Sep. 24, 2020

(65) Prior Publication Data
US 2022/0045417 A1 Feb. 10, 2022

(30) Foreign Application Priority Data
Mar. 15, 2019 (JP) .................. 2019-049153

(51) Int. Cl.
*H03F 3/24* (2006.01)
*H01P 5/19* (2006.01)

(52) U.S. Cl.
CPC .............. *H01P 5/19* (2013.01); *H03F 3/245* (2013.01); *H03F 2200/451* (2013.01)

(58) Field of Classification Search
CPC ... H01P 5/19; H01P 5/16; H03F 3/245; H03F 2200/451; H03H 7/48
(Continued)

(56) References Cited

U.S. PATENT DOCUMENTS 6,411,175 B1 * 6/2002 Sugawara .................. H01P 5/16
333/127
8,130,057 B2 * 3/2012 Jones ....................... H03H 7/48
333/132
(Continued)

FOREIGN PATENT DOCUMENTS

JP U63-059435 A 4/1988
JP 63-246004 A 10/1988
(Continued)

OTHER PUBLICATIONS

International Search Report dated Apr. 7, 2020.

*Primary Examiner* — Hieu P Nguyen
(74) *Attorney, Agent, or Firm* — BACON & THOMAS, PLLC

(57) ABSTRACT

A low-cost, small-size Wilkinson-type combiner that suppresses the risk of damaging an isolation resistor due to combination loss is provided. The combiner comprises first and second input terminals to which RF signals are input; an output terminal; a wiring line that combines the RF signals input to the first and second input terminals, and outputs the combined signal to the output terminal; an isolation unit provided between the first and second input terminals and formed by a first isolation resistor, a transformer, and a second isolation resistor connected in series; a detection circuit connected to a secondary coil of the transformer and configured to detect a current flowing in the secondary coil; and a determination circuit that outputs a control signal to block input of RF signals to the first and second input
(Continued)

terminals if the current flowing in the isolation unit and detected by the detection circuit is higher than or equal to a prescribed value.

6 Claims, 7 Drawing Sheets

(58) Field of Classification Search
USPC .................................................. 330/291, 301
See application file for complete search history.

(56) References Cited

U.S. PATENT DOCUMENTS

| | | | |
|---|---|---|---|
| 10,200,008 B2* | 2/2019 | Thorup | H03H 7/48 |
| 10,381,706 B2* | 8/2019 | Goto | H01P 5/16 |
| 10,608,313 B2* | 3/2020 | Wang | H03H 7/38 |
| 2018/0053984 A1 | 2/2018 | Goto et al. | |

FOREIGN PATENT DOCUMENTS

| | | |
|---|---|---|
| JP | 2015-019153 A | 1/2015 |
| JP | 2016-178446 A | 10/2016 |
| WO | WO2014/185177 A1 | 11/2014 |
| WO | WO2016/151726 A1 | 9/2016 |

* cited by examiner

WILKINSON-TYPE COMBINER AND RF GENERATOR

TECHNICAL FIELD

The present disclosure relates to a Wilkinson-type combiner and an RF generator using same.

BACKGROUND

A Wilkinson-type combiner is known as a circuit for combining RF signals. Patent Document 1 discloses a Wilkinson-type combiner (distributor) for high power. The Wilkinson-type combiner illustrated in FIG. 1 of Patent Document 1 is a circuit having two input terminals and one output terminal, which outputs a combined RF signal from its output terminal when RF signals are input to its two input terminals. An isolation resistor is provided between the two input terminals, and combination loss may occur in case there is an amplitude difference or phase difference between the RF signals input to the two input terminals, which loss will be absorbed by the isolation resistor. Therefore, it is described that the isolation resistor may be damaged due to the combination loss unless the rated power of the isolation resistor is set to be sufficiently high. In addition, there are Patent Documents 2 to 4 as related art documents.

RELATED ART DOCUMENTS

Patent Documents

Patent Document: International Publication No. 2016/151726

Patent Document 2: Japanese Laid-Open Patent Publication No. 2016-178446

Patent Document 3: Japanese Laid-Open Patent Publication No. 2015-19153

Patent Document 4: International Publication No. 2014/185177

In case a Wilkinson-type combiner is used as a combiner of an RF generator, powers input to each of two input terminals are high, combination loss that may occur is also increased according to the increased power of RF signals input thereto. Therefore, in order to avoid damage to an isolation resistor, there is a need to set the rated power to be extremely high. However, the use of an isolation resistor having high rated power leads to an increase in cost. In addition, an increase in size of the resistor itself leads to an increase in size of the combiner as well as of an RF generator.

SUMMARY

One of the objectives of the present disclosure is to provide a low-cost, small-size Wilkinson-type combiner or an RF generator using same while suppressing the risk of damaging an isolation resistor due to combination loss.

A Wilkinson-type combiner is provided, comprising: a first input terminal and a second input terminal to which RF signals are input; an output terminal; a wiring line configured to combine the RF signals input to the first input terminal and the second input terminal and output a combined RF signal to the output terminal; an isolation unit provided between the first input terminal and the second input terminal and formed by a first isolation resistor, a transformer, and a second isolation resistor connected in series; a detection circuit connected to a secondary coil of the transformer and configured to detect a current flowing in the secondary coil; and a determination circuit configured to output a control signal for blocking input of the RF signals to the first input terminal and the second input terminal when the current flowing in the isolation unit detected by the detection circuit is higher than or equal to a predetermined value.

According to the present disclosure, it is possible to provide a low-cost, small-size Wilkinson-type combiner or an RF generator using same while suppressing the risk of damaging an isolation resistor due to combination loss.

Objects, configurations, and effects other than those described above will become apparent from the following description of exemplary embodiments.

DETAILED DESCRIPTION

Figure 1:
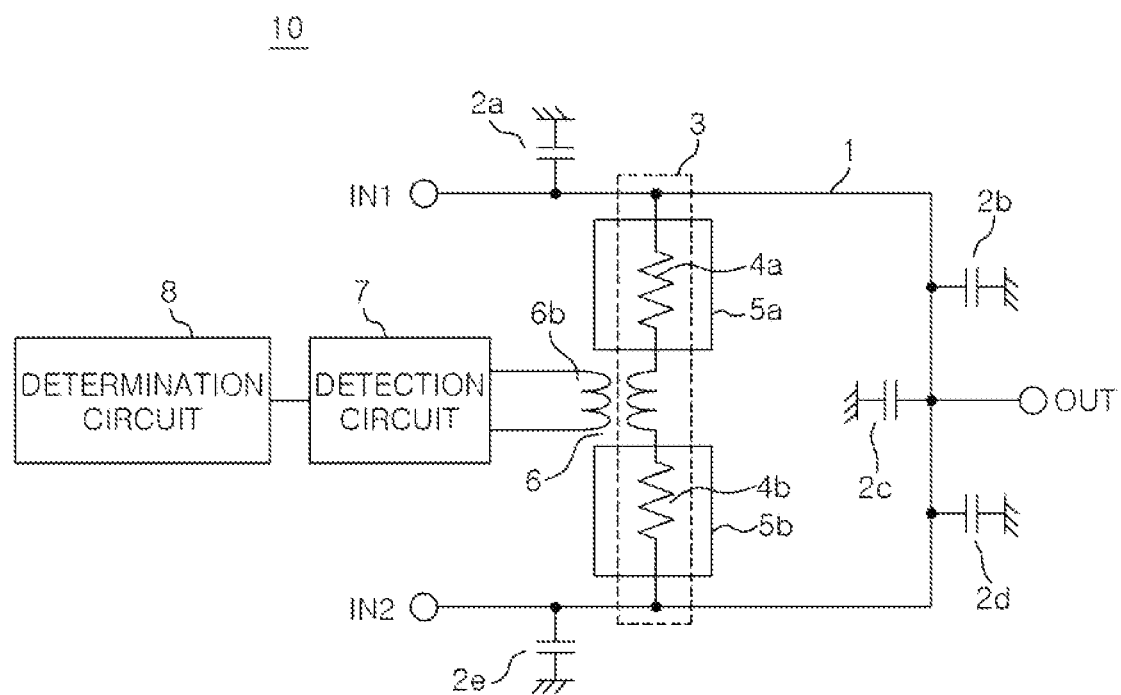
FIG. 1 is a circuit diagram of a Wilkinson-type combiner.

FIG. 1 is a circuit diagram illustrating main parts of a Wilkinson-type combiner 10 of the present exemplary embodiment. In the combiner 10, RF signals input to input terminals IN1 and IN2 are combined in a wiring line 1, and a combined RF signal is output from an output terminal OUT. Capacitors 2a to 2e are provided for impedance matching between partial wiring lines in order to maximize power transmitted by the wiring line 1. In addition, an isolation unit 3 for absorbing combination loss that occurs when there is an amplitude difference or phase difference (hereinafter, referred to as an imbalance) between the RF signals input to the input terminals IN1 and IN2, is provided between the input terminal IN1 and the input terminal IN2. The Wilkinson-type combiner 10 of the present exemplary embodiment has a function of detecting and determining the imbalance between the RF signals input to the input terminals IN1 and IN2 based on a current flowing in the isolation unit 3. To this end, the isolation unit 3 includes a first isolation resistor 4a provided close to the input terminal IN1, a second isolation resistor 4b provided close to the input terminal IN2, and a transformer 6 provided between the first isolation resistor 4a and the second isolation resistor 4b and in series therewith. When there is an imbalance between the RF signals input to the input terminals IN1 and IN2, a current flows in a wiring line of the isolation unit 3 which constitutes the transformer 6. When the current flows in the wiring line of the isolation unit 3, an induced current flows in a secondary coil 6b due to electromagnetic induction. A detection circuit 7 outputs a direct current (DC) voltage based on the magnitude of the induced current flowing in the secondary coil 6b. A determination circuit 8 compares the DC voltage output from the detection circuit 7 with a preset threshold voltage, and outputs a control signal for blocking input of the RF signals to the input terminals IN1 and IN2 when the DC voltage exceeds the threshold voltage. As a result, the input of the RF signals to the input terminals IN1 and IN2 is blocked before the current flowing in the isolation unit 3 reaches a level sufficient to damage the isolation resistors, thereby protecting the Wilkinson-type combiner 10. In addition, the amount of the current flowing in the isolation unit 3 can be detected in any manners, and as long as the determination circuit 8 is able to determine whether the current flowing in the isolation unit is higher than or equal to a predetermined value, the methods for detecting and determining will not be limited.

In addition, the value of the first isolation resistor 4a and the value of the second isolation resistor 4b are set such that they are identical with each other and also such that a combined resistance thereof has a value of an isolation resistance required for the combiner 10. Furthermore, as will be described below, the isolation resistors 4a and 4b are provided with corona rings 5a and 5b, respectively. Since the corona rings serve to form capacitances with respect to a wiring line, it is necessary to take the influences by the corona rings 5a and 5b into account when determining the capacitances of capacitors 2a to 2e.

Figure 2:
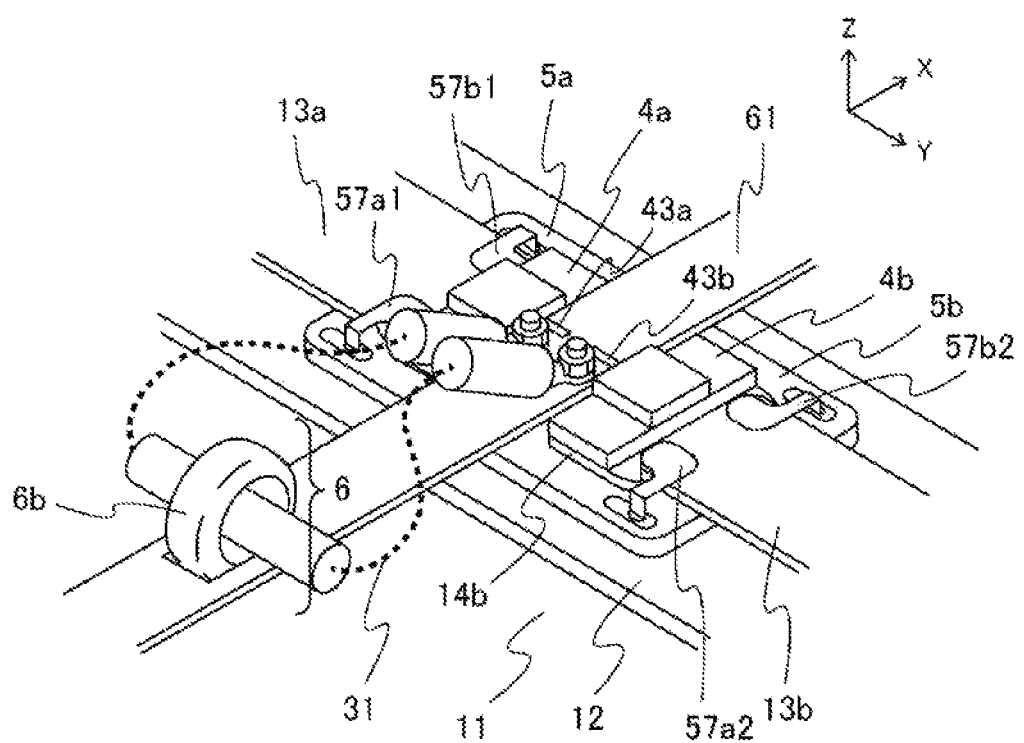
FIG. 2 is a bird's eye view of an isolation unit of the Wilkinson-type combiner.

FIG. 2 is a bird's eye view illustrating an example in which the isolation unit 3 of the Wilkinson-type combiner 10 is mounted. The Wilkinson-type combiner 10 is mounted on a GND plate 11 to which a reference potential (ground potential) GND is applied. The isolation unit 3 is mounted on an insulating substrate 12 disposed on the GND plate 11. A wiring line connecting the wiring line 1 close to the input terminal IN2 (see FIG. 1) and the isolation resistor 4b includes a wiring line plate 13b and a wiring line block 14b. The wiring line block 14b is disposed on the insulating substrate 12, and connected to the wiring line plate 13b and the isolation resistor 4b on its surface opposite to a surface that is in contact with the insulating substrate 12. The isolation unit and the GND plate 11 are insulated from each other by the insulating substrate 12. In addition, the corona ring 5b is disposed on the insulating substrate 12 so as to surround the wiring line block 14b. As will be described below, the corona ring 5b has a structure in which a conductor pattern is interposed between insulating substrates. The conductor pattern is exposed from pattern openings formed in an upper insulating substrate and is connected to a wiring line of the isolation unit 3 (here, the wiring line plate 13b) through connection portions 51a2 and 57b2. A wiring line connecting the wiring line 1 close to the input terminal IN1 and the isolation resistor 4a also has the same structure, and, thus, redundant description thereof will be omitted. It is desirable to make the GND plate 11, the wiring line plate 13, and the wiring line block 14 using low-resistance materials, such as, copper.

The transformer 6 is formed on an insulating circuit board 61. A lead 43a of the isolation resistor 4a and a lead 43b of the isolation resistor 4b are connected through a wire 31 (here, a portion of the wire 31 is illustrated by a dotted line for easy viewing of the drawing). The transformer 6 includes a round ring-shaped magnet (core) around which the secondary coil 6b is wound, and is configured such that the wire 31 passes through the core. A current flowing in the wire 31 causes electromagnetic induction which in turn induces a current to flow in the secondary coil 6b.

Figure 3:
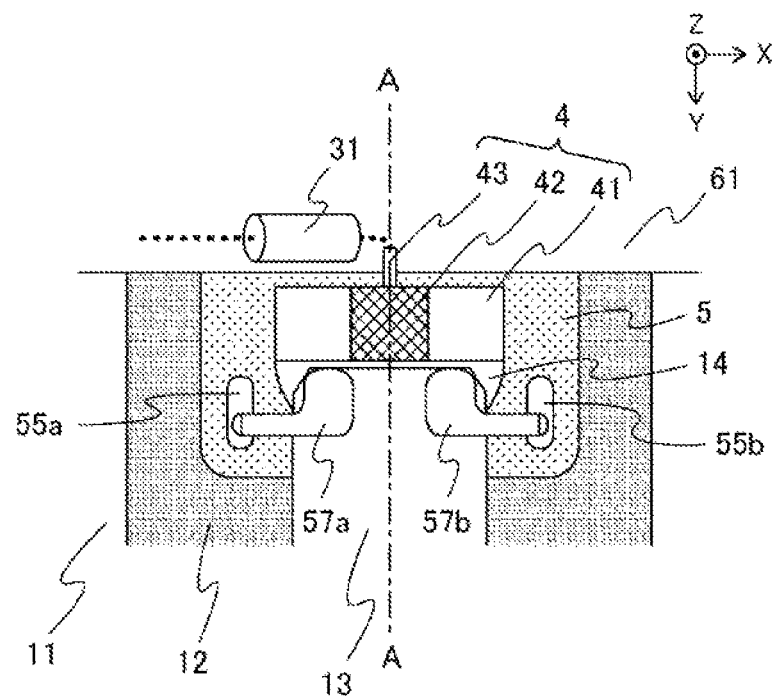
FIG. 3 is a top view of a portion of an isolation unit.
Figure 4:
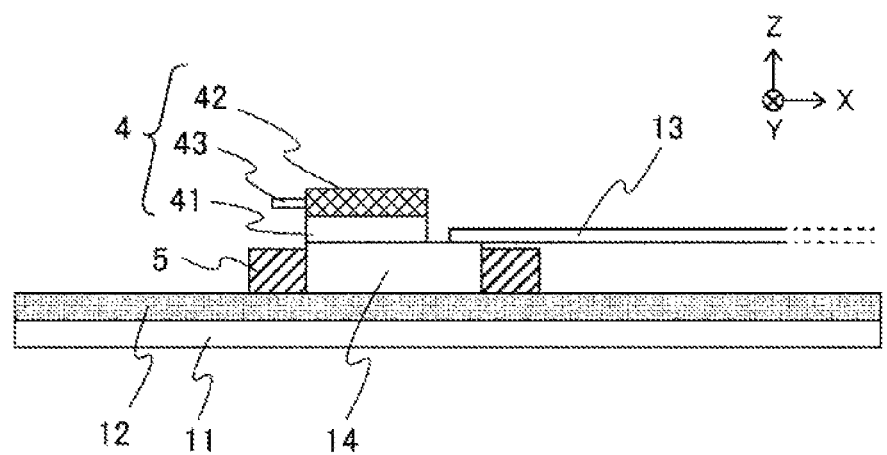
FIG. 4 is a cross-sectional view of the portion of the isolation unit.

FIG. 3 is a top view illustrating the vicinity of an isolation resistor 4 of an isolation unit 3, and FIG. 4 is a cross-sectional view taken along the line A-A of FIG. 3 (wherein a circuit board 61 is omitted). In this regard, both FIGS. 3 and 4 are schematic drawings and priority is given to the ease of understanding of the drawing, and, thus, it is not intended to accurately reproduce the dimension and the like. The isolation resistor 4 is protected with a ceramic package 42, and connects a conductive flange portion 41 and a lead 43 with a predetermined resistance value. Such members may be connected through screwing or the like, and a connection method is not particularly limited.

Figure 5:
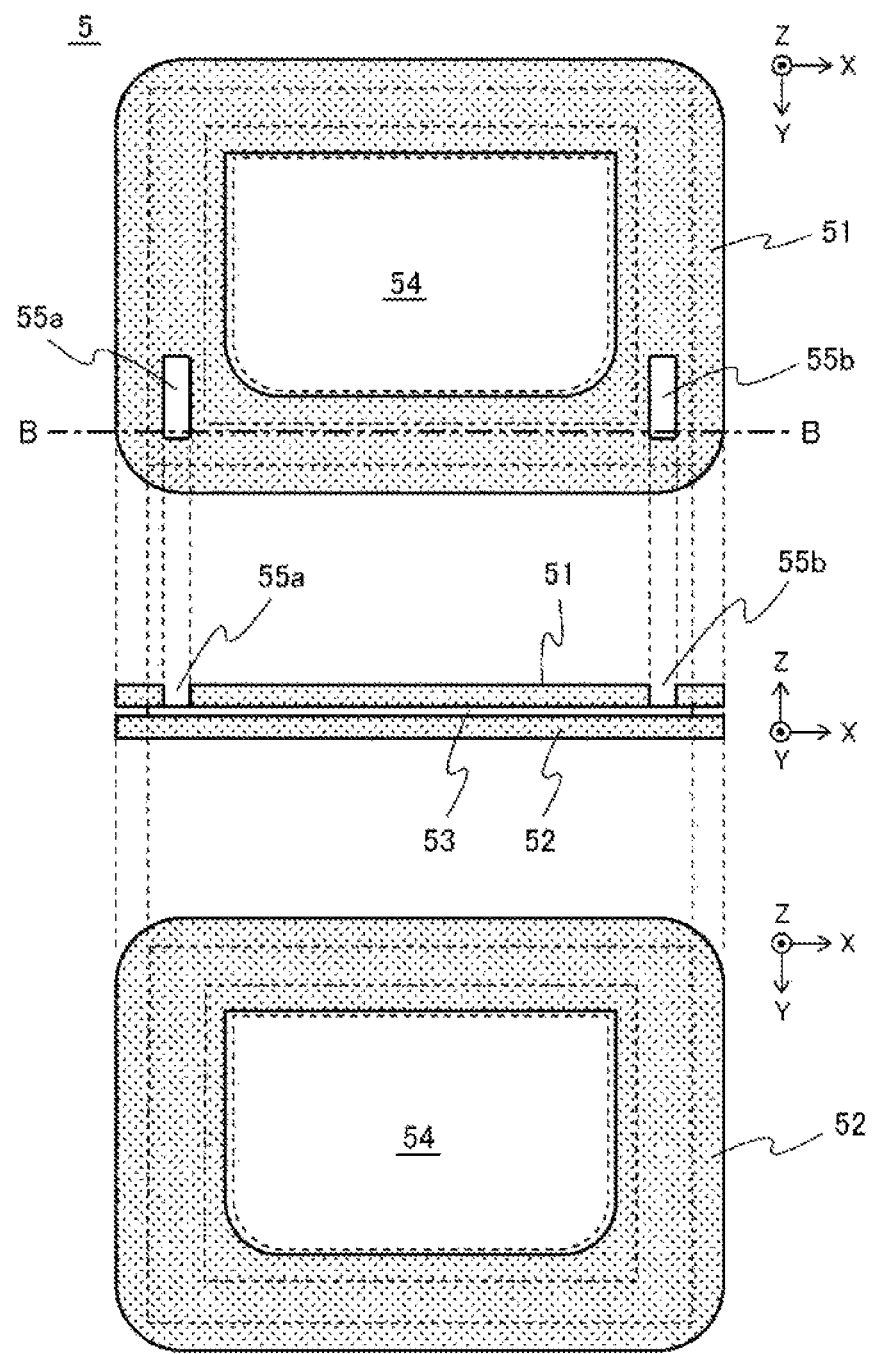
FIG. 5 is a view illustrating a structure of a corona ring.

A structure of a corona ring 5 will be described with reference to FIG. 5. A plan view of an upper insulating substrate 51 is shown at an upper side, a plan view of a lower insulating substrate 52 is shown at a lower side, and a cross-sectional view of the corona ring 5 taken along the line B-B of the upper side drawing is shown in the middle. As shown in the cross-sectional view, the corona ring 5 is formed with a conductor pattern 53 interposed between the upper insulating substrate 51 and the lower insulating substrate 52. The upper insulating substrate 51 and the lower insulating substrate 52 have openings which have the same shape and form an opening 54 of the corona ring 5. In the present example, a wiring line block 14 is disposed in the opening 54. A position at which the wiring line block 14 is disposed is illustrated by a dotted line in the opening 54. In addition, a planar shape of the conductor pattern 53 is a ring shape, which is illustrated by the dotted lines in the plan views of the upper and lower insulating substrates. As described above, in the corona ring 5, the ring-shaped conductor pattern 53 is disposed to surround the wiring line block 14.

Connection openings 55a and 55b are formed in the upper insulating substrate 51, and the conductor pattern 53 is exposed through the connection openings 55a and 55b. As shown in FIGS. 2 and 3, in the connection openings 55a and 55b, the wiring line plate 13 and the conductor pattern 53 are electrically connected by connection portions 57a and 57b.

Figure 6:
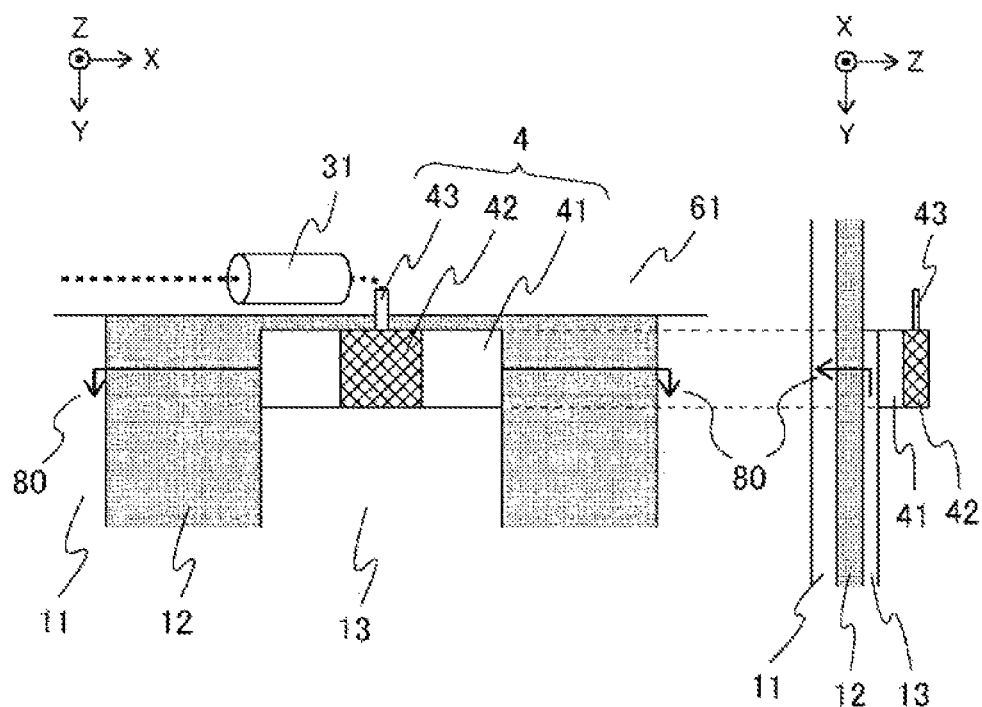
FIG. 6 is a view for describing an effect of a corona ring.

The corona ring 5 is disposed in the isolation unit 3 for the purpose of suppressing occurrence of an electric discharge between a connection portion of a wiring line and of the isolation resistor 4, and a GND plate 11 adjacent thereto. As a comparative example, FIG. 6 shows a top view and a cross-sectional view of the vicinity of the isolation resistor 4 of the isolation unit when a corona ring is not provided (wherein a circuit board 61 is omitted as in FIG. 4). Since the corona ring 5 is not provided in the comparative example, the isolation resistor 4 is in direct contact with the wiring line plate 13. When there is an imbalance between RF signals input to input terminals IN1 and IN2, current flows in the isolation unit 3 and a high potential difference occurs between the wiring line and the GND. Thus, a corona discharge 80 occurs between a portion of the wiring line plate 13 that is in contact with the flange portion 41 of the isolation resistor 4 and the GND plate 11 adjacent thereto. In order to suppress the occurrence of a corona discharge, it is desirable to make a long creepage distance between the flange portion 41 of the isolation resistor 4 and the GND plate 11. Since a corona discharge occurs in a path having a shortest creepage distance, a corona discharge may be suppressed by increasing the width (length in an X-direction) and/or the thickness (length in a Z-direction) of the insulating substrate 12 in this case. In such event, however, the size of the member is also increased. Therefore, in the present exemplary embodiment, the corona ring 5 is provided in the isolation resistor 4 to suppress the occurrence of a corona discharge without increasing the creepage distance between the flange portion 41 of the isolation resistor 4 and the GND plate 11.

The corona ring 5 of the present exemplary embodiment has a structure in which the conductor pattern 53 is interposed between the insulating substrates 51 and 52 such that the corona ring itself (the conductor pattern 53 of the corona ring 5) does not become the source of a new corona discharge. For the same reason, it is desirable to make the size of the connection opening 55 for electrically connecting the wiring line and the conductor pattern 53 as small as possible.

Figure 7:
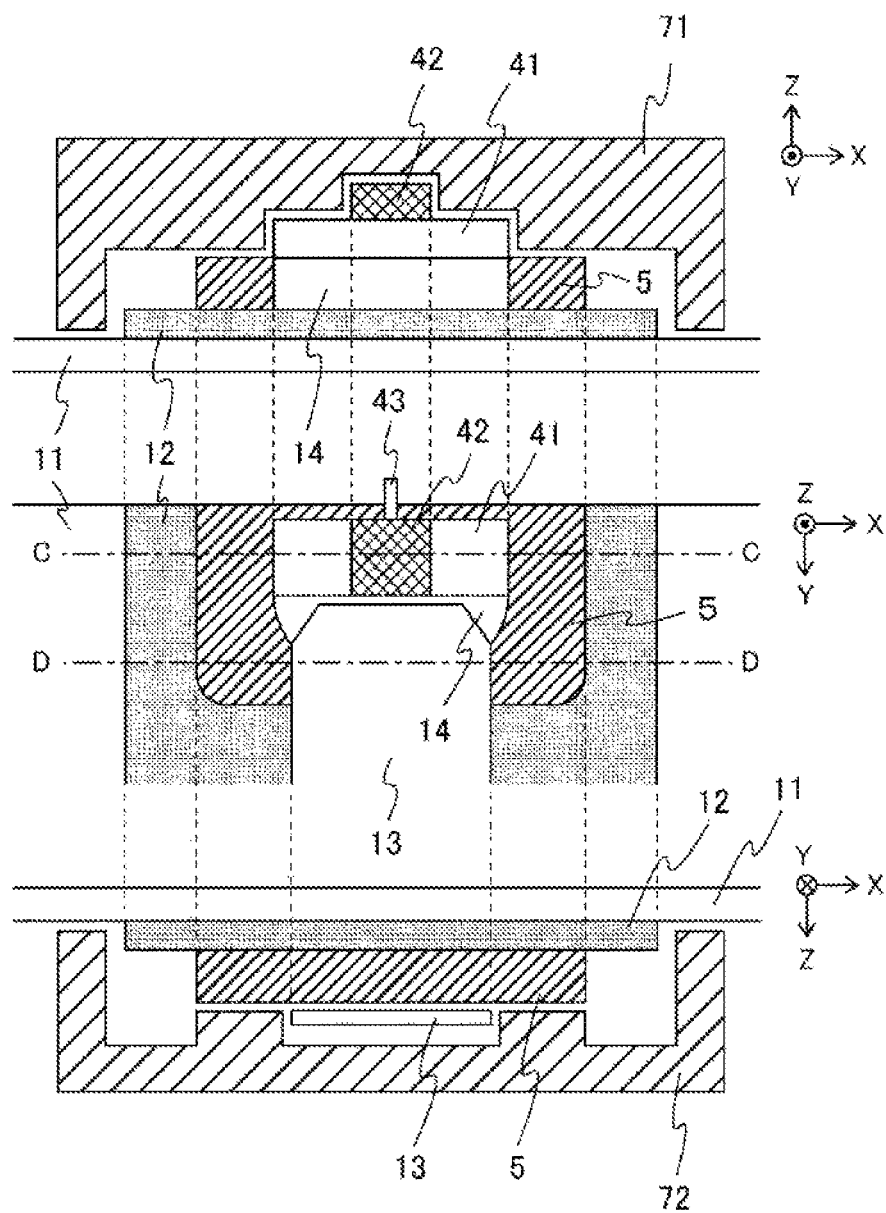
FIG. 7 is a view illustrating a state in which a resistor presser and a corona ring presser are mounted.

In addition, when current flows in the isolation unit 3, heat is generated in the vicinity of the isolation resistor 4. In order for the isolation resistor or the wiring line to be pressed against the insulating substrate to improve heat dissipation, it is desirable to press the wiring line block 14 and the corona ring 5 against the insulating substrate 12 using an insulating resistor presser or corona ring presser. FIG. 7 illustrates a state in which a resistor presser 71 and a corona ring presser 72 are mounted in an isolation unit 3. A top view of the vicinity of the isolation resistor 4 of the isolation unit 3 is shown in the middle (wherein some members are omitted), a cross-sectional view taken along the line C-C is shown at an upper side, and a cross-sectional view taken along the line D-D is shown at a lower side. The resistor presser 71 is fixed at a position along the line C-C, and the corona ring presser 72 is fixed at a position along the line D-D. Since heat transferred to the insulating substrate 12 is also delivered to the GND plate 11 and dissipated, it is preferrable to use a material having high thermal conductivity for the insulating substrate 12. Examples of such a material include aluminum nitride.

The manner of mounting the Wilkinson-type combiner 10 shown in the present exemplary embodiment is merely exemplary, and the present disclosure is not limited thereto. For example, in the present mounting example, a connection resistor is electrically connected to the flange portion 41 of the isolation resistor 4 at an upper side of the wiring line, but it may be electrically connected to the flange portion 41 of the isolation resistor 4 at a lower side of the wiring line. In such case, since the flange portion 41 of the isolation resistor 4 is disposed directly on the insulating substrate 12, it is preferrable to dispose the corona ring 5 so as to surround the flange portion 41. Here, the opening 54 of the corona ring 5 has a shape that corresponds to the flange portion 41. In addition, the resistor presser has a shape which presses the flange portion of the isolation resistor 4 against the insulating substrate 12.

Furthermore, the resistor presser 71 and the corona ring presser may be formed separately or integrally.

Figure 8:
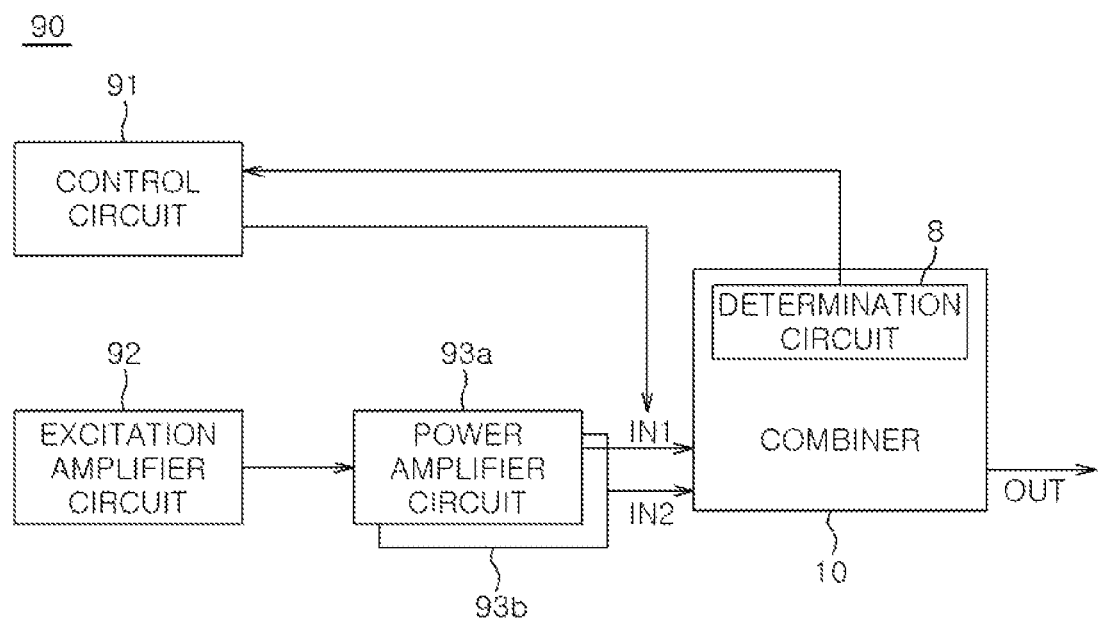
FIG. 8 is a block diagram of an RF generator.

The Wilkinson-type combiner 10 described above is particularly suitable for a combiner of an RF generator having high power (for example, an output of several tens of kilowatts). FIG. 8 is a block diagram illustrating an RF generator using the combiner of the present exemplary embodiment. An RF generator 90 includes a control circuit 91, an excitation amplifier circuit 92, a first power amplifier circuit 93a, a second power amplifier circuit 93b, and a combiner 10.

An RF signal may be generated by an oscillation circuit of the excitation amplifier circuit 92, and the frequency of the RF signal may be determined according to the RF wave supplied to a load by the RF generator 90, for example, an industrial, scientific, and medical (ISM) frequency of 13.56 MHz or 27.12 MHz. An output signal of the excitation amplifier circuit 92 is converted into predetermined power by the power amplifier circuits 93a and 93b and then is supplied to each of input terminals IN1 and IN2 of the combiner 10, and thus, a combined RF signal is output from an output terminal OUT of the combiner 10.

When a determination circuit 8 of the combiner 10 detects that a preset current is flowing in an isolation unit, a control signal for stopping input of the RF signal to the input terminals IN1 and IN2 is output to the control circuit 91.

Accordingly, the control circuit 91 can protect the combiner 10 and the RF generator 90 by blocking the input of the RF signal to the combiner 10.

INDUSTRIAL APPLICABILITY

According to the exemplary embodiments of the present disclosure, a low-cost, small-size Wilkinson-type combiner can be provided while suppressing the risk of damaging an isolation resistor due to combination loss which can be also used for an RF generator. This application claims priority to and the benefit of Japanese Patent Application No. 2019-049153, filed on Mar. 15, 2019, which is incorporated herein by reference in its entirety.

EXPLANATION OF REFERENCE NUMERALS

1: wiring line
2: capacitors
3: isolation unit
4: isolation resistors
5: corona rings
6: transformer
6b: secondary coil
7: detection circuit
8: determination circuit
10: Wilkinson-type combiner
11: GND plate
12: insulating substrate
13: wiring line plate
14: wiring line block
31: wire
41: flange portion
42: ceramic package
43: leads
51: upper insulating substrate
52: lower insulating substrate
53: conductor pattern
54: opening
55: connection openings
57: connection portions
61: circuit board
71: resistor presser
72: corona ring presser
80: corona discharge
90: RF generator
91: control circuit
92: excitation amplifier circuit
93: power amplifier circuits

What is claimed is:
1. A Wilkinson-type combiner comprising:
a first input terminal and a second input terminal to which RF signals are input;
an output terminal;
a wiring line configured to combine the RF signals input to the first input terminal and the second input terminal and output a combined RF signal to the output terminal;
an isolation unit provided between the first input terminal and the second input terminal and formed by a first isolation resistor, a transformer, and a second isolation resistor connected in series;
a detection circuit connected to a secondary coil of the transformer and configured to detect a current flowing in the secondary coil; and
a determination circuit configured to output a control signal for blocking input of the RF signals to the first input terminal and the second input terminal when the current flowing in the isolation unit detected by the detection circuit is higher than or equal to a predetermined value.

2. The Wilkinson-type combiner of claim 1, wherein a corona ring is provided on each of the first isolation resistor and the second isolation resistor.

3. The Wilkinson-type combiner of claim 2, further comprising:
   a GND plate to which a reference potential is applied; and
   an insulating substrate disposed on the GND plate and configured to insulate the isolation unit from the GND plate,
   wherein each of the first isolation resistor and the second isolation resistor includes a flange portion connected to a wiring line of the isolation unit, and
   the corona ring is disposed on the insulating substrate so as to surround the flange portion or the wiring line of the isolation unit connected to the flange portion.

4. The Wilkinson-type combiner of claim 3, wherein the corona ring includes an upper insulating substrate, a lower insulating substrate, and a conductor pattern interposed between the upper and lower insulating substrates,
   the lower insulating substrate is disposed to be in contact with the insulating substrate,
   a connection opening configured to expose the conductor pattern is formed in the upper insulating substrate, and
   the wiring line of the isolation unit and the conductor pattern are electrically connected in the connection opening.

5. The Wilkinson-type combiner of claim 3, further comprising:
   an insulating resistor presser configured to press the first isolation resistor, the second isolation resistor, or the wiring line of the isolation unit connected to the flange portion of the first isolation resistor or the second isolation resistor against the insulating substrate; and
   an insulating corona ring presser configured to press the corona ring against the insulating substrate.

6. An RF generator comprising:
   an excitation amplifier circuit configured to generate an RF signal;
   a first power amplifier circuit and a second power amplifier circuit configured to amplify power of the RF signal generated by the excitation amplifier circuit;
   a combiner to which outputs of the first and second power amplifier circuits are input; and
   a control circuit,
   wherein the combiner is the Wilkinson-type combiner of claim 1,
   each of the outputs of the first and second power amplifier circuits is input to a corresponding one of the first input terminal and the second input terminal, and
   the control circuit receives the control signal from the determination circuit to block input of the RF signals to the first and second input terminals.

* * * * *